United States Patent
Akama et al.

[11] Patent Number: 5,285,151
[45] Date of Patent: Feb. 8, 1994

[54] METHOD AND APPARATUS FOR MEASURING THE BREAKDOWN VOLTAGE OF SEMICONDUCTOR DEVICES

[75] Inventors: Hideo Akama; Hiroshi Nada, both of Tokyo, Japan

[73] Assignee: Hewlett-Packard Company, Palo Alto, Calif.

[21] Appl. No.: 854,205

[22] Filed: Mar. 20, 1992

[30] Foreign Application Priority Data

Mar. 22, 1991 [JP] Japan .................................. 3-83554

[51] Int. Cl.$^5$ ........................................... G01R 31/20
[52] U.S. Cl. ............................... 324/158 R; 324/73.1; 324/158 T
[58] Field of Search ........... 324/158 T, 158 R, 158 D, 324/158 F, 73.1; 371/15.1, 16.1, 25.1; 437/8; 257/48

[56] References Cited

U.S. PATENT DOCUMENTS

| | | | |
|---|---|---|---|
| 3,054,954 | 9/1962 | Boscia et al. | 324/158 T |
| 3,636,450 | 1/1972 | Griffin | 324/158 T |
| 3,883,805 | 5/1975 | Cohn | 324/158 T |
| 3,895,297 | 7/1975 | Jarl | 324/158 T |
| 3,965,420 | 6/1976 | Bennett | 324/158 T |
| 3,979,672 | 9/1976 | Arnoldi | 324/158 T |

OTHER PUBLICATIONS

Hewlett-Packard Company Application Note 356, "-HP 4142B Modular DC Source/Monitor Practical Applications-High Speed DC Characterization of Semiconductor Devices from Sub pA to 1A", Nov. 1987, pp. 5–15 to 5–17.

Hewlett-Packard Company Application Note 356, "-HP 4142B Modular DC Source/Monitor Practical Applications-High Speed DC Characterization of Semiconductor Devices from Sub pA to 1A", Nov. 1987, pp. 5–63 to 5–69.

Hewlett-Packard Company Operation Manual, "HP 4142B Modular DC Source/Monitor", Jun. 1991 p. 5.

Primary Examiner—Vinh Nguyen

[57] ABSTRACT

A ramp voltage is applied through a current limiter 2 to a DUT 3. Setting as a reference time point ($t_1$) a time when a ramp portion of the response voltage V of the DUT 3 has settled to a prescribed value (for example, when the voltage gradient is reduced by a predetermined rate to the ramp rate RR/2), the measurement is carried out, at time $t_2$, after a predetermined interval from the reference time $t_2$. Accordingly, a breakdown voltage is measured before the response voltage V of the DUT 3 is influenced by heat, etc., power consumption is reduced and an excessive stress is not applied to the DUT 3, so that no damage or burning occurs in the DUT 3.

8 Claims, 3 Drawing Sheets

METHOD AND APPARATUS FOR MEASURING THE BREAKDOWN VOLTAGE OF SEMICONDUCTOR DEVICES

FIELD OF THE INVENTION

This invention generally relates to a method for measuring a breakdown voltage, and more particularly relates to methods and apparatus for automatically measuring a breakdown voltage of various kinds of semiconductor devices, such as diodes, thyristors, etc.

BACKGROUND OF THE INVENTION

Semiconductor devices have recently been developed to have a microstructure, and thus they show a marked tendency to be easily damaged or burned with an applied stress, such as Joule heat or the like. This damage of the semiconductor device occurs when a voltage for a breakdown-voltage measurement is applied to a device under test (DUT). That is, when a breakdown-voltage measurement is carried out for a diode or other element, the DUT is temporarily left in a break-down state many times, so that a current flowing through the DUT is regarded as a pulsed current. The DUT suffers from not only a micro-stress due to the pulsed current, but also from a macro-thermal stress due to heat which is caused by the pulsed current and the breakdown voltage.

Both manual and automatic measuring operations have been conventionally adopted for a breakdown voltage of a semiconductor device, and a manner of depressing the above stress as much as possible has been utilized. A curve tracer, for example, is used in the manual measuring operation. As shown in FIG. 1, a DUT is supplied with a half-wave voltage $V_{HS}$ that has a peak value higher than a breakdown voltage $V_{BD}$ of the DUT in the neighborhood of a peak portion of the sine wave, as indicated by an oblique line portion of FIG. 1. The breakdown voltage at a predetermined current value is visually measured by an operator. Representing a period of $V_{HS}$ and a duration time of the breakdown state by T and $t_{BD}$ respectively, the ratio of the breakdown duration to the measuring time is equal to $t_{BD}/T$. For example, in the case where a visual observing time is 3 seconds and $t_{BD}/T$ is 0.1, the breakdown state is continued over 300 ms. Therefore, the stress described above would not be removed for an extended period, and thus the DUT would be damaged or burned.

On the other hand, a ramp voltage generator, for example, may be used in the automatic measuring operation. In this operation, the rise-up of a ramp voltage is set to start at a predetermined time $t_O$, as shown in FIG. 2, and a predetermined voltage is applied to the DUT. When a response voltage V reaches a prescribed value, the DUT suffers from a breakdown, and a breakdown current rapidly flows through the DUT. At this time, a current limiter interposed between the ramp voltage generator and the DUT is actuated to limit the current flowing through the DUT to a predetermined value, whereby the response voltage V of the DUT is controlled to remain constant. Then, after a predetermined amount of time has elapsed from the time $t_O$, the response-voltage V at a time $t_{11}$ is measured to obtain the breakdown voltage $V_{BD}$ at the predetermined current. A ramp rate (RR) of the ramp voltage is determined in consideration of (1) the slew rate of a measuring system, (2) an electrostatic capacity of the DUT and (3) a set value $I_{LIM}$ of the current limiter.

The breakdown voltage is divergent, even for similar kinds of DUTS, and frequently varies, e.g., from 10 V to 100 V, which could be problematic. For example, in comparison of response voltages $V_A$ and $V_B$ of DUTs A and B of FIG. 3B, the ramp rates of the respective DUTs are equal to each other, but the response voltage $V_B$ of the DUT having a lower breakdown voltage suffers from breakdown at an earlier time than the response voltage $V_A$. Therefore, a time interval $T_B$ from the breakdown time of $V_B$ to a measuring time $t_M$ is longer than a corresponding time interval $t_A$. Further, in comparison of response voltages $V_B$ and $V_C$ of DUTs B and C, the response voltage $V_C$ has a higher breakdown voltage than the response voltage $V_B$, but the interval (or measuring time) $T_C$ of $V_C$ is longer than the measuring time $T_B$ of $V_B$ because $V_C$ has a higher ramp rate than $V_B$.

Therefore, measurements under the same conditions cannot be performed for the DUTs A, B and C, and thus there occurs a problem that a uniform measurement procedure can not be used for all DUTS. In addition, in a case where the breakdown continues for a long time (e.g., the case of DUTs B and C whose response voltages are shown in FIG. 3B), the stress becomes excessive; that is, the DUT is damaged or the breakdown voltage varies due to the stress itself. The breakdown voltage also varies due to heat which is caused by the stress. Therefore, there occurs a problem in that the breakdown voltage under a prescribed condition can not be accurately measured. Moreover, there is a further problem in that an expensive ramp voltage generator capable of altering a ramp rate must be used.

Accordingly, an object of the present invention is to overcome the above disadvantages, and in particular to provide methods and apparatus, for measuring a breakdown voltage, by which thermal stress is largely reduced and highly accurate measurements are obtained. A further object of the present invention is to provide means for measuring a breakdown voltage under uniform measuring conditions, so that automatic measurements may be obtained with high reproducibility.

SUMMARY OF THE INVENTION

Methods and apparatus for measuring a breakdown voltage in accordance with the present invention comprise the steps of, or means for, (a) applying to a DUT a ramp voltage through a current limiter so as to subject the DUT to a breakdown condition, and (b) measuring a response voltage of the DUT at an instant of time after a gradient of the response voltage has been lowered by a predetermined amount. A breakdown voltage of the DUT is determinable on the basis of the response voltage. Preferred embodiments of the invention comprise the step of or means for measuring the response voltage at a time when a predetermined time period has elapsed since the gradient of the response voltage has been lowered by the said predetermined amount.

The present invention also encompasses apparatus for measuring a breakdown voltage of a DUT comprising (a) source means for applying a voltage and a current to the DUT; (b) monitor means for monitoring the voltage across the DUT; and (c) controller means for controlling the source means so as to effect the application to the DUT of an increasing voltage characterized by a gradient, and controlling the monitor means to effect the detection of an initial value of the said gradient and the determination of a first instant of time ($t_1$) when the gradient is reduced to a prescribed fraction of the initial value, and to effect the measurement of the breakdown voltage of the DUT at a second instant of time ($t_2$) that bears a predefined relation to $t_1$. Preferred embodiments of the invention further comprise means for limiting the current through the DUT. Further, in one embodiment of the invention $t_2$ is approximately equal to $t_1$, and in another embodiment the time between t1 and t2 is user-settable.

There are many semiconductor elements, such as diodes, in which a response to an applied step voltage rising in a ramp form varies over time, even after the applied voltage has settled to a constant value. The present invention may advantageously be applied to such a DUT. When the DUT is left in the breakdown state, a constant current whose value is restricted by a current limiter flows through the DUT, and the response voltage of the DUT various so as to be settled to a constant value.

In preferred embodiments of this invention, a reference time point is set at a time when a ramp portion of the response voltage of the DUT has settled to a constant value (for example, a time when the voltage gradient is reduced by a predetermined amount in comparison with the ramp rate), and a measurement is performed after a prescribed short time period has elapsed from the reference time point. That is, the measurement of the breakdown voltage is carried out before the response of the DUT varies due to a stress such as heat. In addition, uniform measurements may be made for multiple DUTS. Further, heat due to power consumption is minimized and excessive stress is avoided, so that no damage or burning of the DUT occur. Other features and advantages of the present invention are described below in the remainder of this specification.

DETAILED DESCRIPTION OF PREFERRED EMBODIMENTS

Figure 4A:
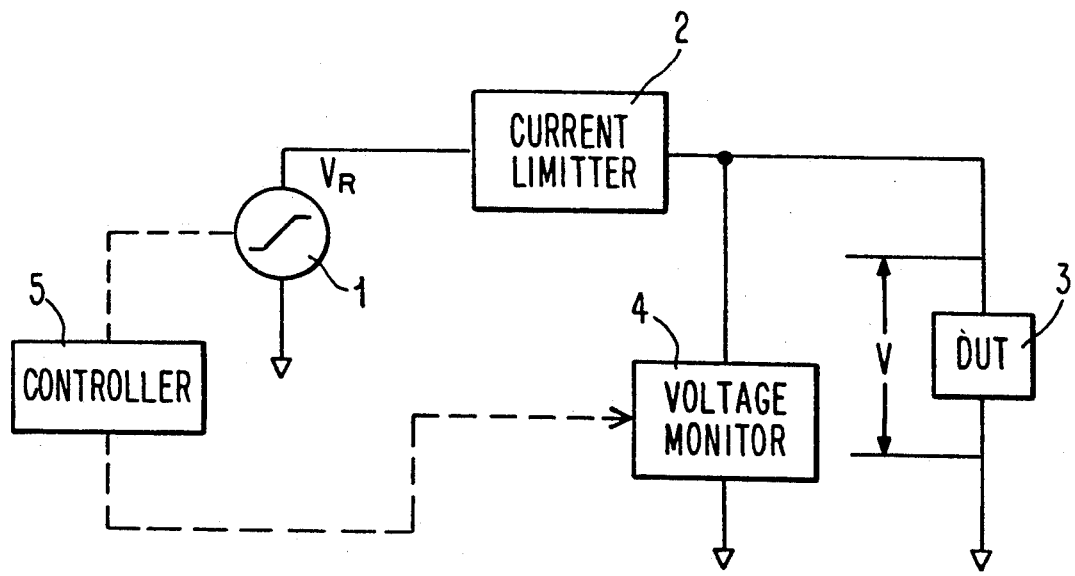
FIG. 4A is a block diagram of one embodiment of a circuit with which the breakdown voltage measuring method of this invention is implemented.

Referring to FIG. 4A, a ramp voltage generator 1 is connected to a DUT 3 through a current limiter 2. The current limiter 2 is so designed that a current limiting value $I_{LIM}$ is suitably alterable. A voltage (response voltage) V between terminals of the DUT 3 is measured by a voltage monitor 4. As shown in FIG. 4A, the generation of a ramp voltage $V_R$ by the ramp voltage generator 1 and the measurement of the response voltage V of the DUT by the voltage monitor 4 are performed under the supervision of a controller 5 (comprising a CPU).

Figure 4B:
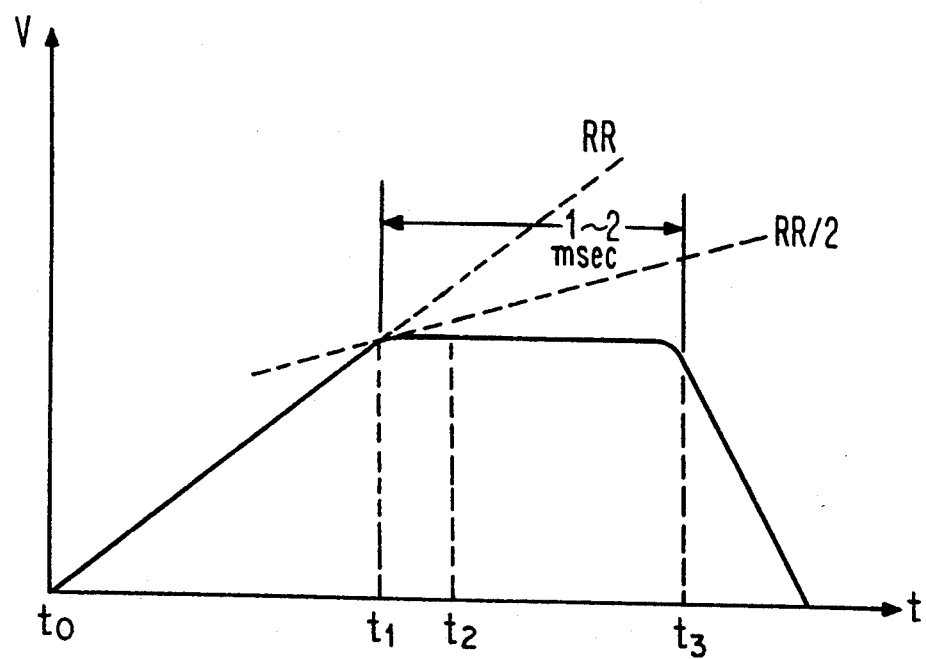
FIG. 4B is a graph of an exemplary response voltage of the DUT of the circuit of FIG. 4A.

A breakdown voltage measuring procedure in accordance with the present invention will now be described with reference to FIG. 4B. First, the current limiting value $I_{LIM}$ for the ramp voltage generator 1 is prescribed. This set value is a breakdown current $I_{BD}$ for a breakdown voltage $V_{BD}$ to be measured. At this time, the controller 5 instructs the ramp voltage generator 1 to generate a ramp voltage $V_R$. Upon application of the ramp voltage $V_R$, the response voltage V of the DUT 3 rises up in a ramp form (see time $t_0$ in FIG. 4B).

The ramp rate RR of the response voltage V of the DUT 3 at this time is preferably set to such a value that a discharge current $I_C$ is not larger than the current limiting value $I_{LIM}$. For example, the current limiting value $I_{LEM}$ may be set so as to satisfy the following equation (1):

$$I_{LIM} > C(dV/dt) \tag{1}$$

where C is the capacitance value of the DUT.

Otherwise, in consideration of a leak current $I_{LEAK}$ of the DUT 3, the current limiting value $I_{LIM}$ may be set so as to satisfy the following equation (2):

$$I_{LIM} > C(dV/dt) + I_{LEAK} \tag{2}$$

In accordance with the invention, the gradient SR of the response voltage V of the DUT, which gradually increases, is continuously detected by the voltage monitor 4. When the voltage V to be supplied to the DUT 3 is gradually increased and reaches the breakdown voltage $V_{BD}$, the breakdown current $I_{BD}$ rapidly flows through the DUT. When $I_{BD}$ is increased to $I_{LIM}$, the current limiter 2 outputs a feedback signal to the ramp voltage generator 1 to reduce the response voltage gradient SR. In this process, the gradient SR of the response voltage V varies so as to be settled to a 0 value while $I_{BD}$ is settled to $I_{LIM}$.

A time point $t_1$ (hereinafter referred to as the "reference time point") when the gradient SR has been lowered by a predetermined amount is detected by the voltage monitor 4. Usually, the lowering of the gradient SR by the predetermined amount is determined with a ratio of the gradient SR to the ramp rate RR. In FIG. 4B, a time point when SR is equal to RR/2 is set as the reference time point $t_1$.

A response voltage V of the DUT 3 at the reference time point $t_1$ or at a time $t_2$ when a constant time has elapsed since the reference time point $t_1$ (these times are set by the user) is measured as a breakdown voltage $V_{BD}$, and therefore the output voltage of the ramp voltage generator 1 is set to zero.

Figure 1:
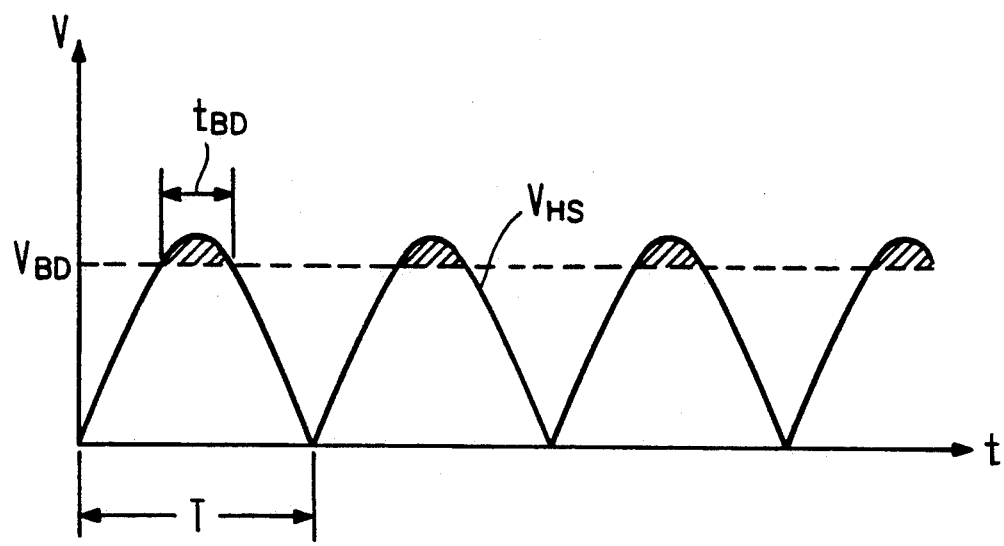
FIG. 1 is an explanatory diagram for showing a conventional measuring method for measuring a breakdown voltage with a curve tracer.
Figure 2:
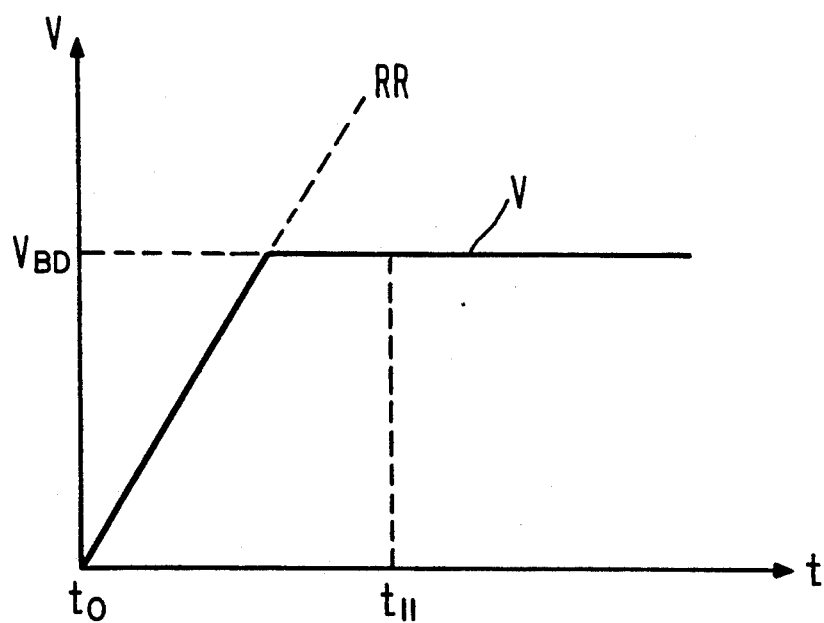
FIG. 2 is an explanatory diagram for showing a conventional measuring method for measuring a breakdown voltage with a ramp voltage generator.
Figure 3A:
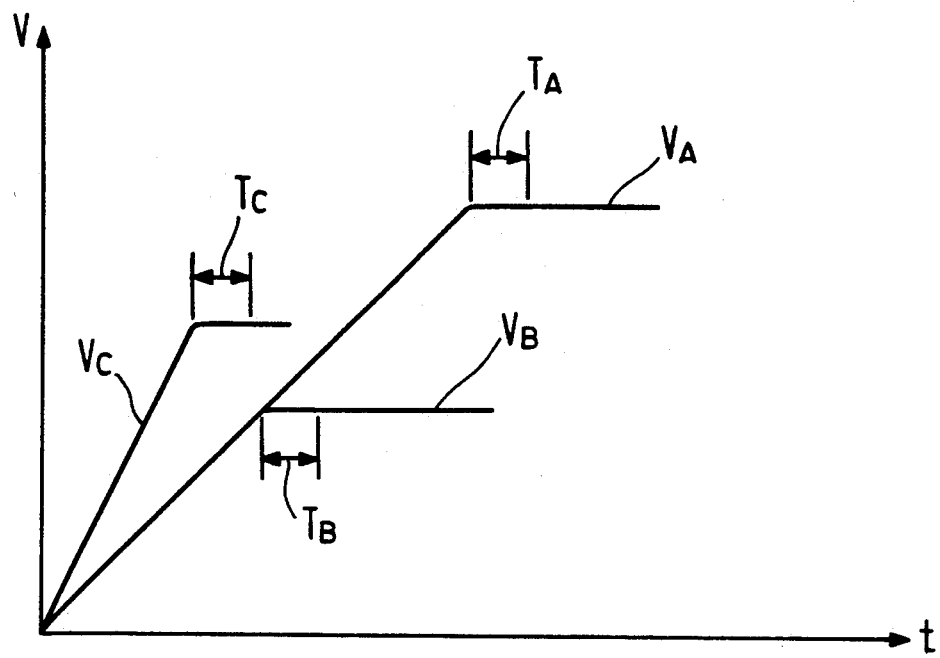
FIG. 3A is an explanatory diagram of an effect of the breakdown voltage measuring method of this invention.
Figure 3B:
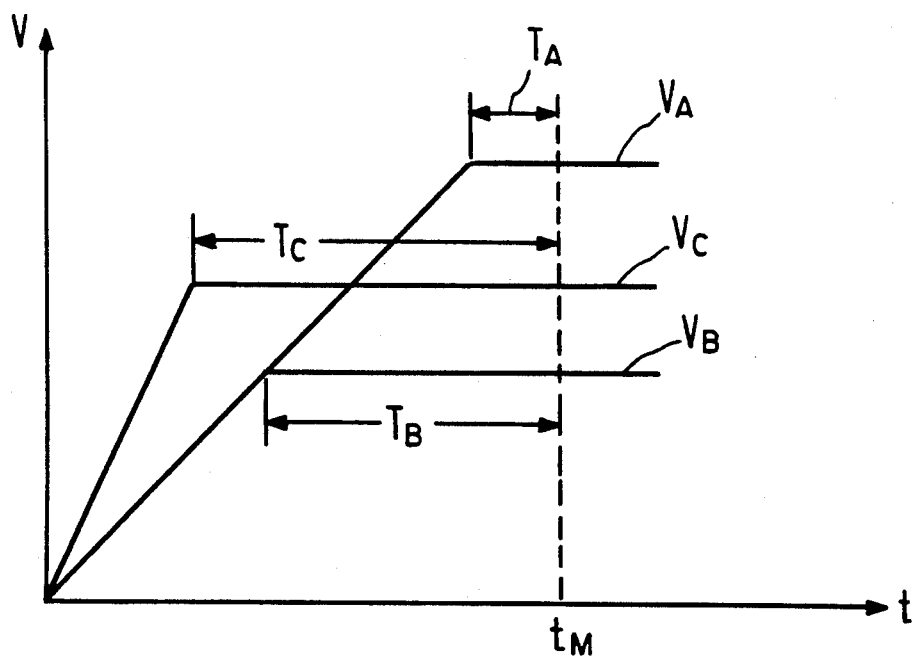
FIG. 3B is an explanatory diagram of a disadvantage of the conventional measuring method.

With the above method, the time interval from the end of rise-up time $t_1$ of the response voltage V to the end of the measuring time t3 can be shortened to 1 to 2 ms from the 300 ms of the conventional, prior art methods. In addition, an amount of heat due to the stress can be greatly reduced to 1/150 of that obtained with the measuring method using the curve tracer (FIG. 1) and to 1/50 of that obtained with the method using the ramp voltage (FIG. 2). Further, as shown in FIG. 3A, even if the breakdown voltages of plural DUTs (A, B, C) are different from one another and the ramp rates RR of the respective response voltages $V_A$, $V_B$ and $V_C$ are different from one another (however, the ramp rates of the response voltages $V_A$ and $V_B$ are equal to each other in FIG. 3A), no variation occurs in the measurements and high reproducibility is obtained because the measurement for each DUT is carried out after a fixed time ($T_A$, $T_B$, $T_C$) has elapsed since the breakdown occurs.

Thus, the present invention offers the following advantages:

(1) The invention does not use a rise-up time of the response voltage of the DUT as a reference time. Therefore, it is not necessary to use means for determining the ramp rate in consideration of the electrostatic capacity and charge voltage to thereby improve the measurement accuracy. As a result, measurements can be made at high speed.

(2) Since the measurement can be made within a short period of time from the occurrence of the breakdown, the stress to the DUT is minimized and the DUT therefore does not suffer from damage or burning.

(3) Since the power through each DUT is kept relatively constant, the measuring condition becomes uniform and thus a measuring method with high reproducibility can be provided.

(4) It is not required to use a ramp voltage generator whose ramp rate is alterable, and thus manufacturing costs can be lowered.

Although specific exemplary embodiments of the present invention are described in this specification, the true scope of the invention, as described in the following claims, is not limited to such exemplary embodiments.

What is claimed is:

1. A method for measuring a breakdown voltage of a device under test (DUT), comprising the steps of:
   (a) applying to said DUT a ramp voltage through a current limiter so as to subject the DUT to a breakdown; and
   (b) measuring a response voltage of the DUT at an instant of time after a gradient of the response voltage has been lowered by a predetermined amount, whereby a breakdown voltage of the DUT is determinable on the basis of said response voltage.

2. The method recited in claim 1, comprising measuring said response voltage at a time when a predetermined time period has elapsed since said gradient of said response voltage has been lowered by said predetermined amount.

3. An apparatus for measuring a breakdown voltage of a device under test (DUT), comprising:
   (a) a current limiter;
   (b) means for applying to said DUT a ramp voltage through said current limiter so as to subject the DUT to a breakdown; and
   (c) means for measuring a response voltage of the DUT at an instant of time after a gradient of the response voltage has been lowered by a predetermined amount, whereby a breakdown voltage of the DUT is determinable on the basis of said response voltage.

4. The apparatus recited in claim 3, comprising means for measuring said response voltage at a time when a predetermined time period has elapsed since said gradient of said response voltage has been lowered by said predetermined amount.

5. An apparatus for measuring a breakdown voltage of a device under test (DUT), comprising:
   (a) source means for applying a voltage and a current to said DUT;
   (b) monitor means for monitoring the voltage across said DUT; and
   (c) controller means for controlling said source means so as to effect the application to said DUT of an increasing voltage characterized by a gradient, and controlling said monitor means to effect the detection of an initial value of said gradient before the breakdown of said DUT and the determination of a first instant of time ($t_1$) when said gradient is reduced to a prescribed fraction of said initial value, and to effect the measurement of the breakdown voltage of said DUT at a second instant of time ($t_2$) that bears a predefined relation to said first instant of time.

6. The apparatus recited in claim 5, further comprising means, connected in series with said source means and said DUT, for limiting the current through said DUT.

7. The apparatus recited in claim 6, wherein $t_2$ is approximately equal to $t_1$.

8. The apparatus recited in claim 6, wherein $t_2$ is less than $t_1 + 2$ msec.

* * * * *